United States Patent [19]
Park

[11] Patent Number: 5,501,999
[45] Date of Patent: Mar. 26, 1996

[54] PROCESS FOR FORMATION OF CAPACITOR FOR DRAM CELL

[75] Inventor: Gum-Jin Park, Buk-ku, Rep. of Korea

[73] Assignee: LG Semicon, Co. Ltd., Cheongju, Rep. of Korea

[21] Appl. No.: 420,546

[22] Filed: Apr. 12, 1995

[30] Foreign Application Priority Data

Apr. 12, 1994 [KR] Rep. of Korea .................. 94-7590

[51] Int. Cl.⁶ .................................................. H01L 21/8242
[52] U.S. Cl. ........................ 437/52; 437/60; 437/919
[58] Field of Search ........................... 437/47, 48, 52, 437/60, 919; 257/306, 307, 308

[56] References Cited

U.S. PATENT DOCUMENTS

| | | | |
|---|---|---|---|
| 5,006,481 | 4/1991 | Chan et al. | 437/47 |
| 5,114,873 | 5/1992 | Kim et al. | 437/60 |
| 5,162,249 | 11/1992 | Kim | 437/60 |
| 5,227,322 | 7/1993 | Ko et al. | 437/52 |
| 5,270,238 | 12/1993 | Kim | 437/60 |

FOREIGN PATENT DOCUMENTS 92-9748  10/1992  Rep. of Korea .................. 27/108

*Primary Examiner*—Tom Thomas
*Attorney, Agent, or Firm*—Alan R. Loudermilk

[57] ABSTRACT

A DRAM cell and a process for formation of a capacitor of a DRAM cell. The present invention provides a lower plate electrode consisting of a first conductive layer formed upon a first inter-layer insulating layer, the first inter-layer insulating layer covering the cell region except a contact hole portion; a capacitor dielectric layer formed on the surface of the lower plate electrode; a capacitor lower node electrode consisting of a second conductive layer formed on the dielectric layer and contacting with the source of a pass transistor; a bit line layer disposed upon a second insulating layer and connected to the drain region of the pass transistor through the second inter-layer insulating layer (disposed upon the lower node electrode); a capacitor upper node electrode consisting of a third conductive layer and connected to the capacitor lower node electrode after passing through the second inter-layer insulating layer and through a fourth insulating layer (disposed upon the bit line layer); a capacitor dielectric layer formed upon the capacitor upper node electrode; and a capacitor upper plate electrode consisting of a fourth conductive layer formed on the dielectric layer.

16 Claims, 4 Drawing Sheets

PROCESS FOR FORMATION OF CAPACITOR FOR DRAM CELL

FIELD OF THE INVENTION

The present invention relates to semiconductor dynamic random access memory ("DRAM") cells, and more particularly to a capacitor for a DRAM dynamic random access memory ("DRAM") and a process for formation thereof in which the capacitance is increased without enlarging the area of the capacitor.

BACKGROUND OF THE INVENTION

In accordance with the increase in the integration of semiconductor memory devices, the area occupied by memory cells of a memory device has to be reduced to the minimum degree possible so as to increase the density of the device. Further, while the area occupied by the capacitor of the memory cell has to be minimized, the capacitance of the capacitor must be maintained over a certain value. Therefore, efforts are being made to increase the capacitance of the capacitor within a small area and limited space.

Particularly, in a DRAM cell consisting of one transistor and one capacitor, various capacitor structures have been proposed for application to 4 mega-bit, 16 mega-bit, and 256 mega-bit scale DRAM cells. A typical capacitor structure is constituted such that a V or U shaped trench is formed so as to utilize the wall of the trench as capacitor area. Another capacitor structure is the stacked type structure.

A conventional capacitor structure is described in a disclosure by Ahn Dae-Hyuk, published on Oct. 22, 1992, and entitled "Stacked Type Capacitor Structure and Formation Process Therefor". This reference will be briefly described referring to FIGS. 3 and 4. FIG. 3 is a layout of this structure, and FIG. 4 is a sectional view taken along the line X-Y-Z of FIG. 3.

The process for forming this conventional structure includes: a first step of forming device isolating oxide layer 41, source and drain regions 42 and 43, and word line electrodes 44, 45 and 46 on semiconductor substrate 40, then forming insulating layer 47 thereupon, and etching insulating layer 47 (formed on source region 42) so as to expose the surface of source region 42 and form a contact opening; a second step of forming bridge electrode layer 48 covering the upper surface of device isolating oxide layer 41 and the surface of source region 42 (exposed by the first contact opening), and forming polysilicon oxide layer 49 by a thermal oxidation process on the surface of bridge electrode layer 48; a third step of forming inter-layer insulating layer 50 on the whole surface of the substrate, and etching insulating layer 47 and inter-layer insulating layer 50 (formed on drain region 43) so as to expose the surface of drain region 43, and form a contact opening; forming bit line layer 51 on the whole surface of the substrate, forming a required pattern of bit line layer 51, forming inter-layer insulating layer 52 on the whole surface of the substrate, and sequentially etching inter-layer insulating layer 52 (over the relevant portions of bridge electrode layer 48), inter-layer insulating layer 50 and polysilicon oxide layer 49 so as to expose the relevant surfaces of bridge electrode layer 48 and form a contact opening; a fifth step of spreading polysilicon layer 54 on the whole surface of the substrate, doping a conduction-type impurity into polysilicon layer 54 and forming an electrode layer; and a sixth step of spreading dielectric layer 55 on the whole surface of the substrate to a certain thickness, and forming second polysilicon layer 56 upon dielectric layer 55.

The DRAM cell of this conventional technique includes: device isolating oxide layer 41 formed on the relevant portions of semiconductor substrate 40; source and drain regions 42 and 43; word line electrodes 44, 45 and 46; bridge electrode layer 48 having insulating layer 47 for covering word line electrodes 44, 45 and 46, for contacting with source region 42, and for covering the upper surface of device isolating oxide layer 41; bit line layer 51 contacting with drain region 43, and extending in parallel with the substrate surface upon bridge electrode layer 48; polysilicon layer 54 connected to bridge electrode layer 48 and extending over bit line layer 51; dielectric layer 55 covering the whole surface of the substrate including the upper surface of polysilicon layer 54; polysilicon layer 56 covering the upper surface of dielectric layer 55, and extending at least over bit line layer 51; and inter-layer isolating layers 50 and 52 for isolating bit line layer 51 from bridge electrode layer 48, polysilicon layer 54 and dielectric layer 55.

In the conventional technique as described above, as can be seen in the layout and in the sectional structure, bridge electrode layer 48 occupies a large area and a large space, but it cannot play the role of a capacitor, with the result that there is a limit in increasing the capacitance of the capacitor.

SUMMARY OF THE INVENTION

The present invention is intended to overcome the above described disadvantages of the conventional technique.

Therefore it is an object of the present invention to provide a DRAM cell and a process for formation of the capacitor of a DRAM cell in which the bridge portion, which could not play the role of capacitor in conventional structures, is rendered to provide capacitance, thereby increasing the capacitance of the capacitor.

In achieving the above object, a DRAM cell of a semiconductor memory having a source region, a drain region, a gate electrode of a pass transistor and a stacked capacitor on the relevant portions of a semiconductor substrate according to the present invention, includes: a lower plate electrode consisting of a first conductive layer formed upon a first inter-layer insulating layer, the first inter-layer insulating layer covering the cell region except the contact hole portion; a capacitor dielectric layer formed on the surface of the lower plate electrode; a capacitor lower node electrode consisting of a second conductive layer formed on the dielectric layer and contacting with the source region of the pass transistor; a bit line layer disposed upon a second insulating layer and connected to the drain region of the pass transistor through the second inter-layer insulating layer (disposed upon the lower node electrode); a capacitor upper node electrode consisting of a third conductive layer and connected to the capacitor lower node electrode through the second inter-layer insulating layer and through a fourth insulating layer (disposed upon the bit line layer); a capacitor dielectric layer formed upon the capacitor upper node electrode; and a capacitor upper plate electrode consisting of a fourth conductive layer formed on the dielectric layer (formed on the surface of the upper node electrode).

In achieving the above object, a process for forming a capacitor for a DRAM cell according to the present invention, includes the steps of: (1) forming a pass transistor on the relevant portion of a semiconductor substrate, covering the pass transistor with a first inter-layer insulating layer, depositing a first conductive layer on the overall surface, and etching the first conductive layer and the first inter-layer insulating layer (where contacts are to be formed) so as to form a lower plate electrode; (2) forming a capacitor dielectric layer on the surface of the lower plate electrode; (3) etching the portion of the capacitor dielectric layer (where a contact and the source of the pass transistor are to be formed), depositing a second conductive layer on the overall surface, and patterning the lower node electrode of the capacitor; (4) forming a second inter-layer insulating layer on the overall surface, forming a via hole to connect the capacitor lower node electrode and the upper node electrode, forming a third conductive layer, and forming a capacitor upper node electrode; and (5) forming a dielectric layer on the capacitor upper node electrode, and forming a fourth conductive layer so as to form an upper plate electrode.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
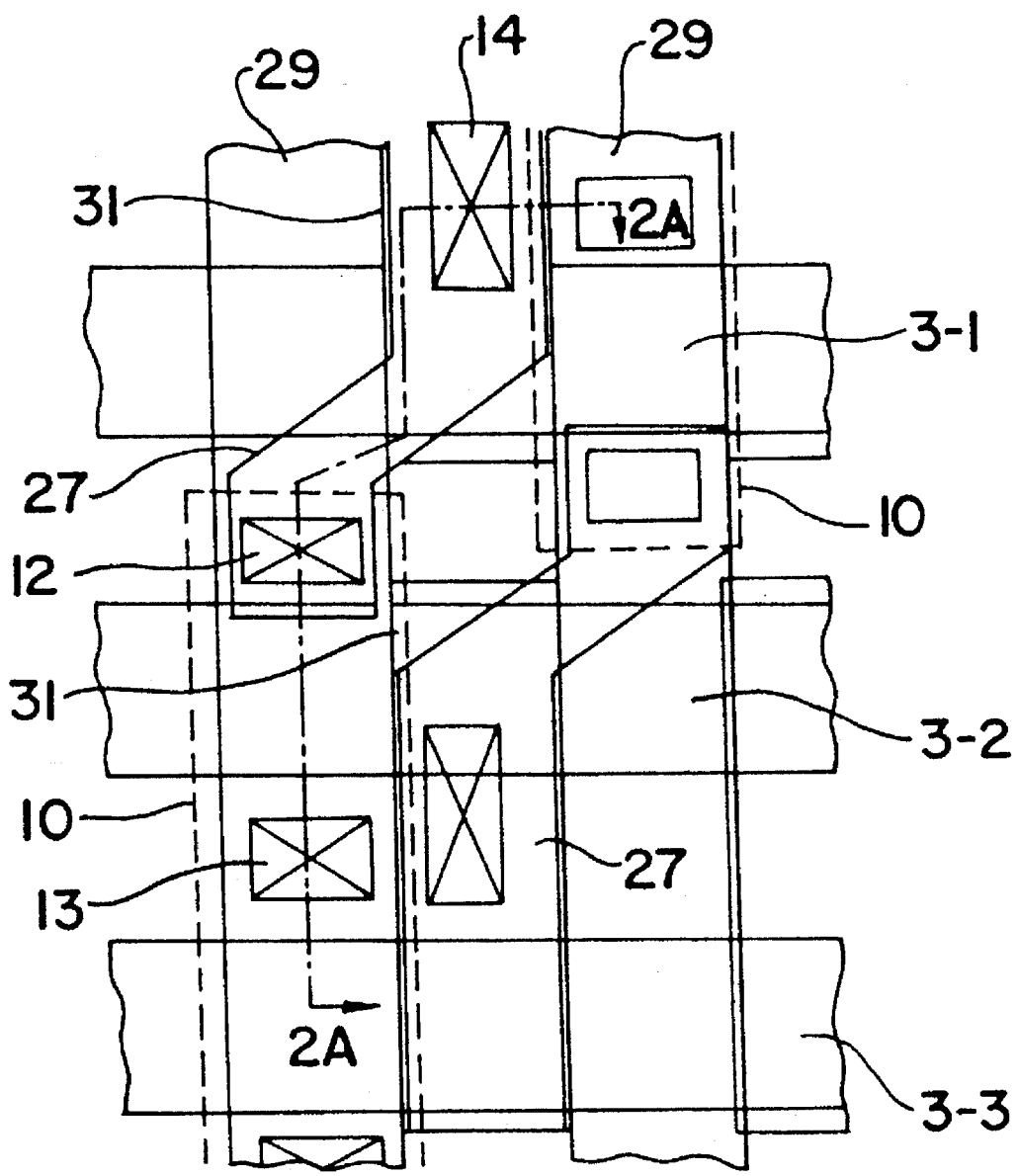
FIG. 1 illustrates the layout of a DRAM cell according to the present invention.

FIG. 1 illustrates the layout of a DRAM cell according to the present invention, and FIG. 2 is a sectional view taken along line 2A—2A of FIG. 1 for illustrating the process for forming a capacitor for a DRAM cell according to the present invention.

Figure 2A:
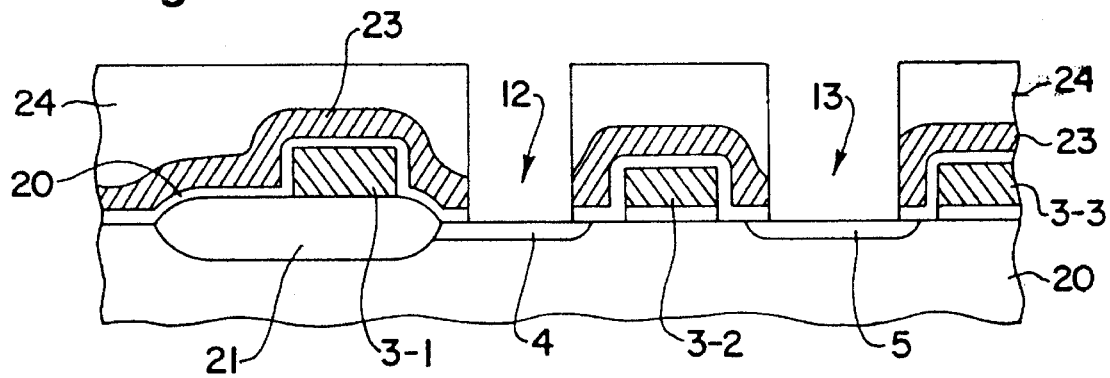
FIGS. 2A–2D are sectional views taken along line 2A—2A of FIG. 1 for illustrating the process for forming a capacitor for a DRAM cell according to the present invention.

As illustrated in FIG. 2A, field oxide layer 21 is formed on semiconductor substrate 20 so as to delineate active region 10 and a field region. Gate 3 (3-1, 3-2, 3-3), source region 4 and drain region 5 are formed, thereby forming a pass transistor. CVD oxide layer 22 as a first insulating layer is deposited under an atmosphere of $SiH_4+O_2$ at a temperature of about 350°–700° C. to a thickness of about 3,000–6,000 Å. Polysilicon layer as a first conductive layer for forming capacitor lower plate electrode 23 is deposited by applying an LPCVD method at a temperature of about 540°–620° C. to a thickness of about 1,500–2,000 Å. Photo resist 24 is utilized to define contact portion 12 for connecting source region 4 to a node electrode, which is a storage electrode, and to define drain region contact portion 13 for connection to the bit line. Polysilicon layer 23 and first insulating layer 22 are etched to form a contact hole.

Figure 2B:
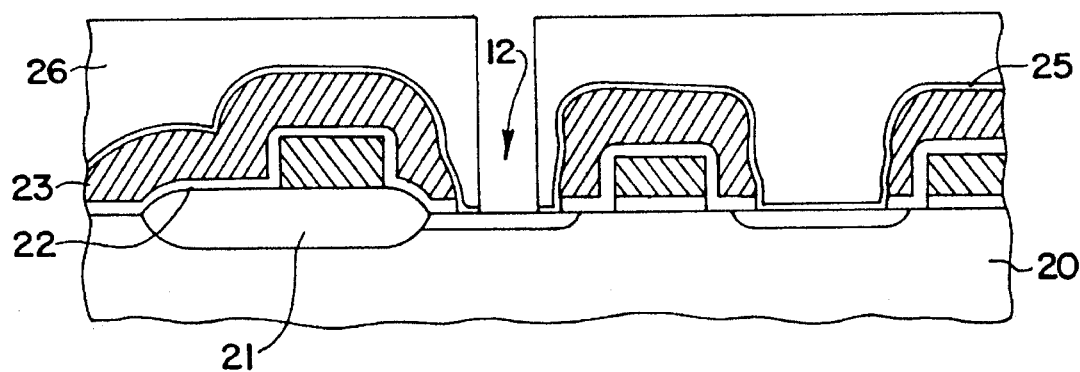

As illustrated in FIG. 2B, second insulating layer 25 for the capacitor (dielectric layer) is formed, which may be formed in such a manner that an LPCVD nitride layer is deposited to a thickness of about 50–100 Å, and an oxidation is carried out at a temperature of about 850°–1,000° C. Photo resist 26 is utilized to define node contact portion 12 for connecting the storage electrode of the capacitor to the source electrode. Insulating layer 25 is etched to form a contact hole. Under this condition, a mask is prepared in such a manner that the contact hole thus formed is slightly smaller than the previously formed contact hole, thereby preventing exposure of the lower plate electrode due to misalignment.

Figure 2C:
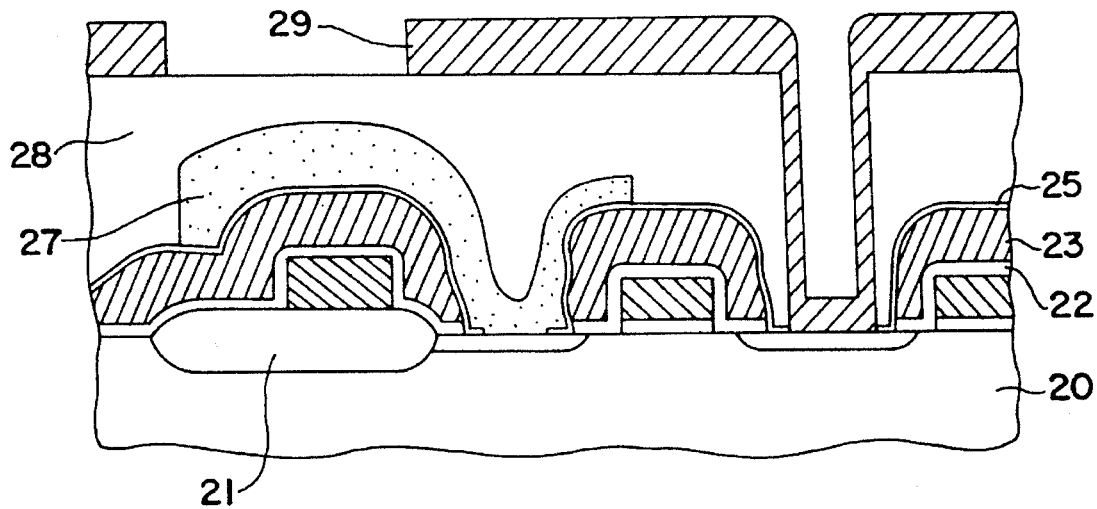

As illustrated in FIG. 2C, a polysilicon layer as a second conductive layer for lower node electrode 27, which is the capacitor storage electrode, is deposited to a thickness of about 1,500–2,000 Å by applying an LPCVD method at a temperature of 540°–620° C., and lower node electrode 27 is patterned. Third insulating layer 28 as an inter-layer insulating layer is deposited on the overall surface to a thickness of about 5,000–10,000 Å by applying a CVD method. The bit line contact portion is etched so as to form a bit line contact hole, and either a polysilicon layer as bit line layer 29 is deposited to a thickness of about 2,000 Å by applying an LPCVD method, or alternatively tungsten silicide $WSi_2$ is deposited to a thickness of about 1,400–1,500 Å by applying an LPCVD method, with a patterning being carried out thereafter. Under this condition, a sputtering may be used, or tungsten may be deposited upon the polysilicon layer so as to "silicidize".

Figure 2D:
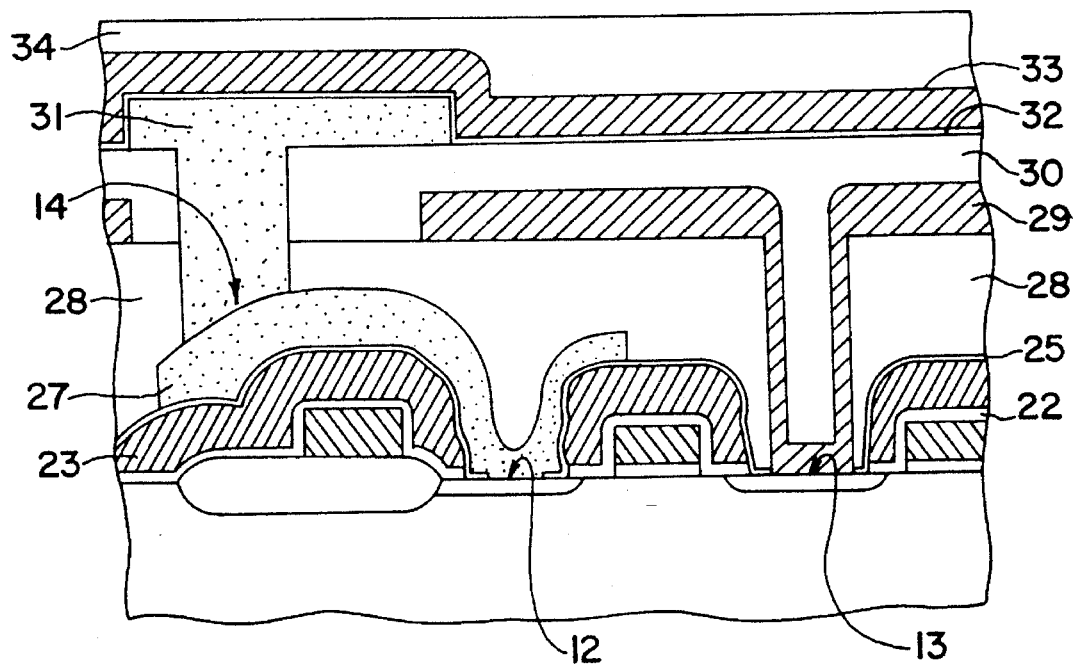
Figure 3:
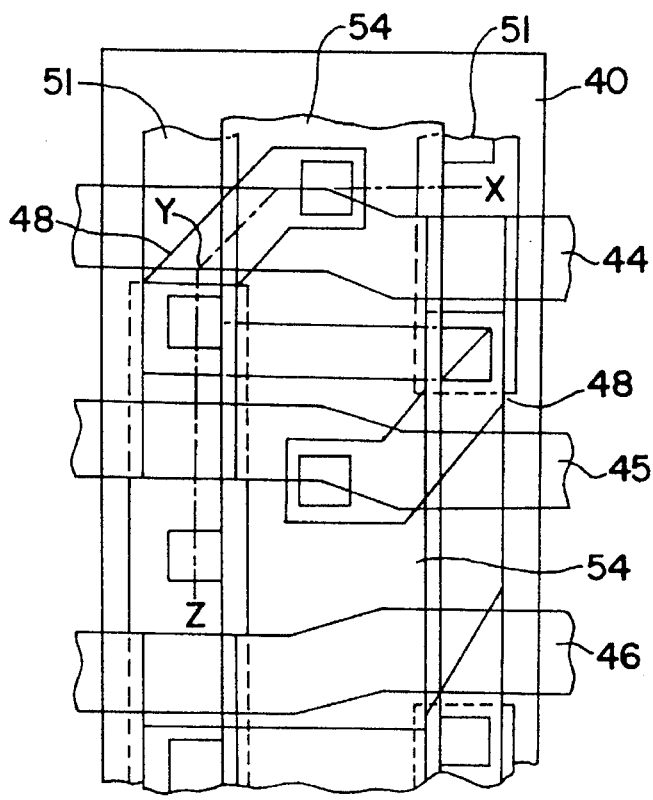
FIG. 3 is a plan view illustrating a conventional DRAM cell.
Figure 4:
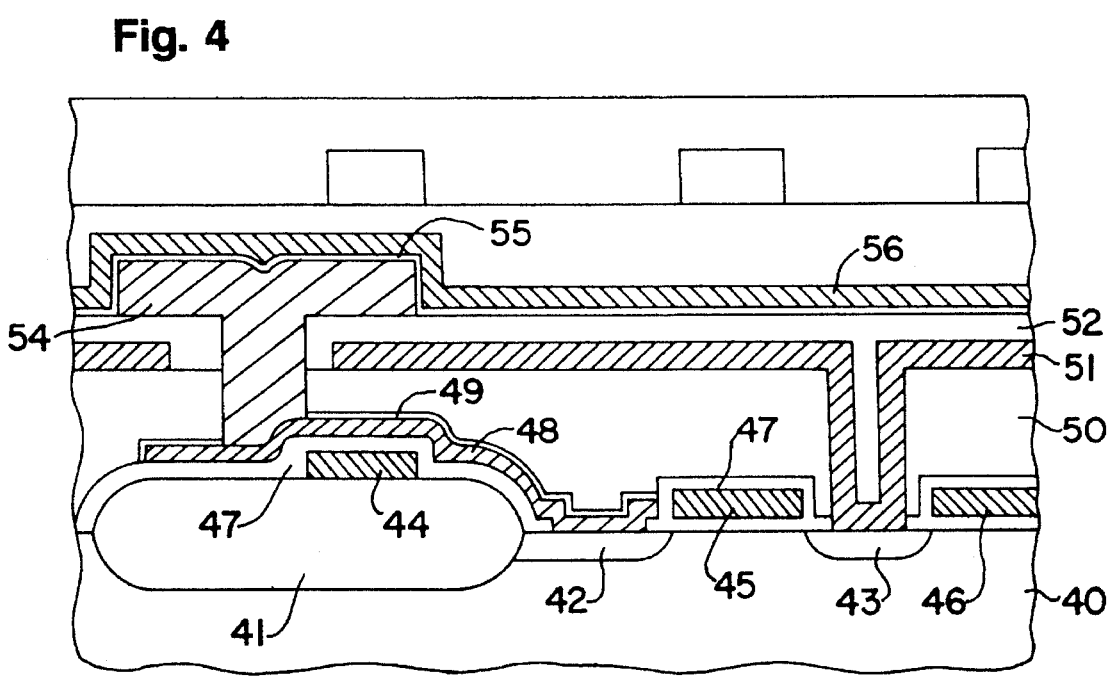
FIG. 4 is a partially sectional view illustrating a process for forming a capacitor for a conventional DRAM cell.

As illustrated in FIG. 2D, silicon oxide or BPSG fourth insulating layer 30 is deposited to a thickness of about 5,000–10,000 Å by applying a CVD method. In order to form contact portion 14, which connects the lower node electrode and the upper node electrode together, there is formed a via hole extending to lower node electrode 27. A polysilicon layer as a third conductive layer and as upper node electrode 31 is deposited to a thickness of about 1,500–2,000 Å, and a patterning is carried out.

An LPCVD nitride layer as fifth insulating layer 32 and as a capacitor dielectric layer is deposited to a thickness of about 50–100 Å, and an oxidation is carried out at a temperature of about 850°–1,000° C. A polysilicon layer as a fourth conductive layer and as upper plate electrode 33 is deposited on the overall surface to a thickness of about 2,000 Å by applying an LPCVD method. A process for connecting the lower plate electrode to the upper plate electrode may be separately carried out in a conventional manner, or alternatively the two plate electrodes may be connected together by forming a via hole prior to forming the fourth conductive layer, and then depositing the fourth conductive layer. As an example alternative, a separate via hole may be formed between the lower and upper plate electrodes, and a conductive layer (such as polysilicon or a metal such as aluminum, tungsten silicide or the like) may be formed and patterned to connect the lower and upper plate electrodes. Alternatively, the lower and upper plate electrodes may be separately connected to a common reference voltage in a conventional manner.

In forming the capacitor dielectric layer, a dielectric may be selected from among NO, ONO, $Ta_2O_5$, and $Y_2O_5$. In forming the first to fourth conductive layers, materials may be selected from high melting point metals such as tungsten, tantalum and the like. CVD insulating layer 34 for passivation may be deposited on the whole surface to a thickness of about 5,000–10,000 Å.

According to the present invention as described above, the capacitance can be almost doubled with the almost the same layout as that of a conventional structure. That is, while there is a portion for connecting the capacitor node electrode to the source region of the transistor of the cell in the conventional technique, this portion is combined with an additional lower plate electrode so as to greatly increase the capacitance in the present invention.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a capacitor for a memory cell, comprising the steps of:
   (a) forming a transistor having a gate electrode and a source and drain on a semiconductor substrate, forming a first inter-layer insulating layer on the substrate and transistor, depositing a first conductive layer on the first inter-layer insulating layer, and etching the first conductive layer and the first inter-layer insulating layer to form a lower plate electrode;
   (b) forming a capacitor dielectric layer on the lower plate electrode and the substrate;
   (c) etching the capacitor dielectric layer to form a contact to the source of the transistor, depositing a second conductive layer on the capacitor dielectric layer and the substrate, and patterning the second conductive layer to form a lower node electrode;
   (d) forming a second inter-layer insulating layer on the lower node electrode and the dielectric layer, forming a via hole to the lower node electrode, forming a third conductive layer, and patterning the third conductive layer to form an upper node electrode; and
   (e) forming a dielectric layer on the upper node electrode, forming a fourth conductive layer on the dielectric layer, and patterning the fourth conductive layer to form an upper plate electrode.

2. The process of claim 1, wherein, at step (d), the process further comprises the steps of etching the second inter-layer insulating layer to form a bit line contact to the drain of the transistor, depositing a conductive layer, and patterning the conductive layer to form a bit line.

3. The process of claim 1, further comprising the steps of forming a contact hole between the lower plate electrode and the upper plate electrode, depositing a fifth conductive layer, wherein the fifth conductive layer connects the lower plate electrode and the upper plate electrode.

4. The process of claim 1, wherein the first to fourth conductive layers comprise a high melting point conductive material.

5. The process of claim 1, wherein the first to fourth conductive layers comprise polysilicon.

6. The process of claim 1, wherein the capacitor dielectric layer comprises a material selected from the group of NO, ONO, $Ta_2O_5$ and $Y_2O_5$.

7. The process of claim 1, wherein the lower capacitor electrode extends over the gate electrode of the transistor.

8. The process of claim 1, wherein the bit line comprises a high melting point metal.

9. The process of claim 8, wherein the high melting point metal comprises a material selected from the group of tungsten and tungsten silicide.

10. A process for formation of a capacitor for a memory cell, comprising the steps of:
    (a) forming a transistor on a semiconductor substrate, depositing a first inter-layer insulating layer on the transistor and the substrate, depositing a first conductive layer on the first inter-layer insulating layer, and etching the first inter-layer insulating layer and the first conductive layer at a bit line contact region and a node contact region;
    (b) forming a second insulating layer on the first conductive layer and the substrate, etching the second insulating layer in the node contact region;
    (c) depositing a second conductive layer, and patterning the second conductive layer to form a lower node electrode of the capacitor;
    (d) forming a third insulating layer on the second conductive layer and the second insulating layer, forming a bit line connected to the transistor, depositing a fourth insulating layer, forming a via hole through the fourth insulating layer to the lower node electrode, depositing a third conductive layer and patterning the third conductive layer to form an upper node electrode;
    (e) forming a fifth insulating layer as a dielectric layer on the upper node electrode, and forming a fourth conductive layer on the fifth insulating layer to form an upper plate electrode.

11. The process of claim 10, wherein, at step (a), after forming the transistor on the semiconductor substrate, the first inter-layer insulating layer comprises a CVD oxide layer deposited to a thickness of about 3,000–6,000 Å under an atmosphere of $SiH_4+O_2$ at a temperature of about 350°–700° C.

12. The process of claim 10, wherein, at step (a), the first conductive layer for the lower plate electrode is formed by depositing polysilicon to a thickness of about 1,500–2,000 Å by applying an LPCVD method at a temperature of about 540°–620° C.

13. The process of claim 10, wherein, at steps (b) and (e), the second insulating layer and the fifth insulating layer are formed by depositing LPCVD nitride layers to a thickness of about 50–100 Å and by oxidizing the nitride layers at a temperature of about 850°–1,000° C.

14. The process of claim 10, wherein, at step (c), the second conductive layer for the lower node electrode is formed by depositing LPCVD polysilicon to a thickness of about 1,500– 2,000 Å at a temperature of about 540°–620° C.

15. The process of claim 10, wherein, at step (d), the third insulating layer is formed by depositing a CVD silicon oxide layer or BPSG to a thickness of about 5,000–10,000 Å.

16. The process of claim 10, wherein the lower capacitor electrode extends over a gate of the transistor.

* * * * *